(12) United States Patent
Lee et al.

(10) Patent No.: US 7,156,160 B2
(45) Date of Patent: Jan. 2, 2007

(54) INTEGRATED LIQUID COOLING SYSTEM FOR ELECTRONIC COMPONENTS

(75) Inventors: Hsieh Kun Lee, Tu-chen (TW); Cheng-tien Lai, Tu-chen (TW); Shi-Wen Zhou, Shenzhen (CN)

(73) Assignees: Fu Zhun Precision Ind. (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 0 days.

(21) Appl. No.: 10/946,702

(22) Filed: Sep. 21, 2004

(65) Prior Publication Data

US 2005/0098305 A1    May 12, 2005

(30) Foreign Application Priority Data

Nov. 7, 2003   (TW) ............... 92219772 U

(51) Int. Cl.
F28D 15/00   (2006.01)
H05K 7/20   (2006.01)

(52) U.S. Cl. ................ 165/104.33; 165/80.4; 361/699

(58) Field of Classification Search ......... 165/104.33, 165/80.4, 80.5, 67, 170; 361/698–699; 257/714
See application file for complete search history.

(56) References Cited

U.S. PATENT DOCUMENTS

| | | | | |
|---|---|---|---|---|
| 3,524,497 A | * | 8/1970 | Chu et al. ................. | 165/80.4 |
| 5,005,640 A | * | 4/1991 | Lapinski et al. ............ | 165/170 |
| 5,309,319 A | * | 5/1994 | Messina ..................... | 361/699 |
| 5,349,831 A | * | 9/1994 | Daikoku et al. ............. | 62/376 |
| 5,731,954 A | * | 3/1998 | Cheon ........................ | 361/699 |
| 5,763,951 A | * | 6/1998 | Hamilton et al. ........... | 257/714 |
| 5,964,206 A | * | 10/1999 | White et al. ................ | 123/541 |
| 6,019,165 A | * | 2/2000 | Batchelder ................. | 165/80.3 |
| 6,702,002 B1 | * | 3/2004 | Wang ........................ | 165/80.3 |
| 6,745,823 B1 | * | 6/2004 | Brost ......................... | 165/80.4 |
| 6,778,394 B1 | * | 8/2004 | Oikawa et al. ............. | 361/700 |
| 6,860,242 B1 | * | 3/2005 | Schenk ..................... | 123/41.31 |

FOREIGN PATENT DOCUMENTS

| | | |
|---|---|---|
| CN | ZL98248834.3 | 11/1999 |
| CN | ZL99210734.2 | 4/2000 |

* cited by examiner

*Primary Examiner*—Tho Duong
(74) *Attorney, Agent, or Firm*—Wei Te Chung

(57) ABSTRACT

A liquid cooling system includes a container (10) defining communicable first and second chambers (125a, 125b) therein, a pump (15) mounted on the container and having an entrance port (152) in flow communication with the second chamber, and an exit port (150) in flow communication with the first chamber so that the pump, the first chamber, and the second chamber together form a loop for circulation of coolant, and a heat dissipation unit (2) located at the loop for cooling the coolant.

11 Claims, 4 Drawing Sheets

INTEGRATED LIQUID COOLING SYSTEM FOR ELECTRONIC COMPONENTS

BACKGROUND OF THE INVENTION

1. Field of the Invention

The present invention relates generally to cooling systems, and more particularly to a liquid cooling system for rapidly cooling an electronic component such as a Central Processing Unit (CPU).

2. Related Art

With the continuing development of computer electronics technology, new electronic packages such as the latest CPUs can perform more and more functions. Heat generated by these modern electronic packages has increased commensurately. The heat must be removed from the CPUs to prevent them from becoming unstable or being damaged. The traditional cooling means such as any combinations of heat sinks and cooling fans are increasingly unable to provide satisfactory cooling performance. To obtain an enhanced cooling performance, cooling systems that using liquid cooling technology have been developed for cooling the CPUs.

Chinese patent numbers 98248834.3 and 99210734.2 respectively disclose one kind of these cooling systems. These cooling systems generally each comprise a cooling base contacting the CPU for absorbing heat generated by the CPU. The cooling base generally defines a cavity containing liquid coolant therein, and an inlet and an outlet both in communication with the cavity. The cooling system also comprises a heat sink and a pump arranged at proper locations within a computer enclosure. A first tube connects the inlet of the cooling base with the pump, so that the coolant enters the cavity along the first tube by the driving force of the pump. A second tube connects the outlet of the cooling base with the pump, so that the heated coolant exits from the cavity along the second tube by the driving force of the pump. The second tube extends through the heat sink, whereupon heat of the heated coolant is transferred to the heat sink to radiate to ambient air. Thus, the heat of the CPU is continuously taken away by circulation of the coolant.

However, the cooling base, the tubes, the heat sink, and the pump are discrete components prior to attachment within the computer enclosure. Installation and removal of the cooling system can be troublesome and time-consuming. In addition, a large space for these discrete components is required. This militates against the minimization trend of electronic devices.

SUMMARY OF THE INVENTION

Accordingly, an object of the present invention is to provide a integrated liquid cooling system which can be rapidly and easily installed to or removed from an electronic enclosure.

To achieve the above-mentioned object, a liquid cooling system in accordance with a preferred embodiment of the present invention comprises a container defining communicable first and second chambers therein, a flow driver mounted on the container and having an entrance port in flow communication with the second chamber, and an exit port in flow communication with the first chamber so that the driver, the first chamber, and the second chamber together form a loop for circulation of coolant, and a heat dissipation unit located at the loop that is outside the container and between the driver and the second chamber for cooling the coolant.

Other objects, advantages and novel features of the present invention will be drawn from the following detailed description of the preferred embodiment of the present invention with attached drawings, in which:

DETAILED DESCRIPTION OF THE INVENTION

Figure 1:
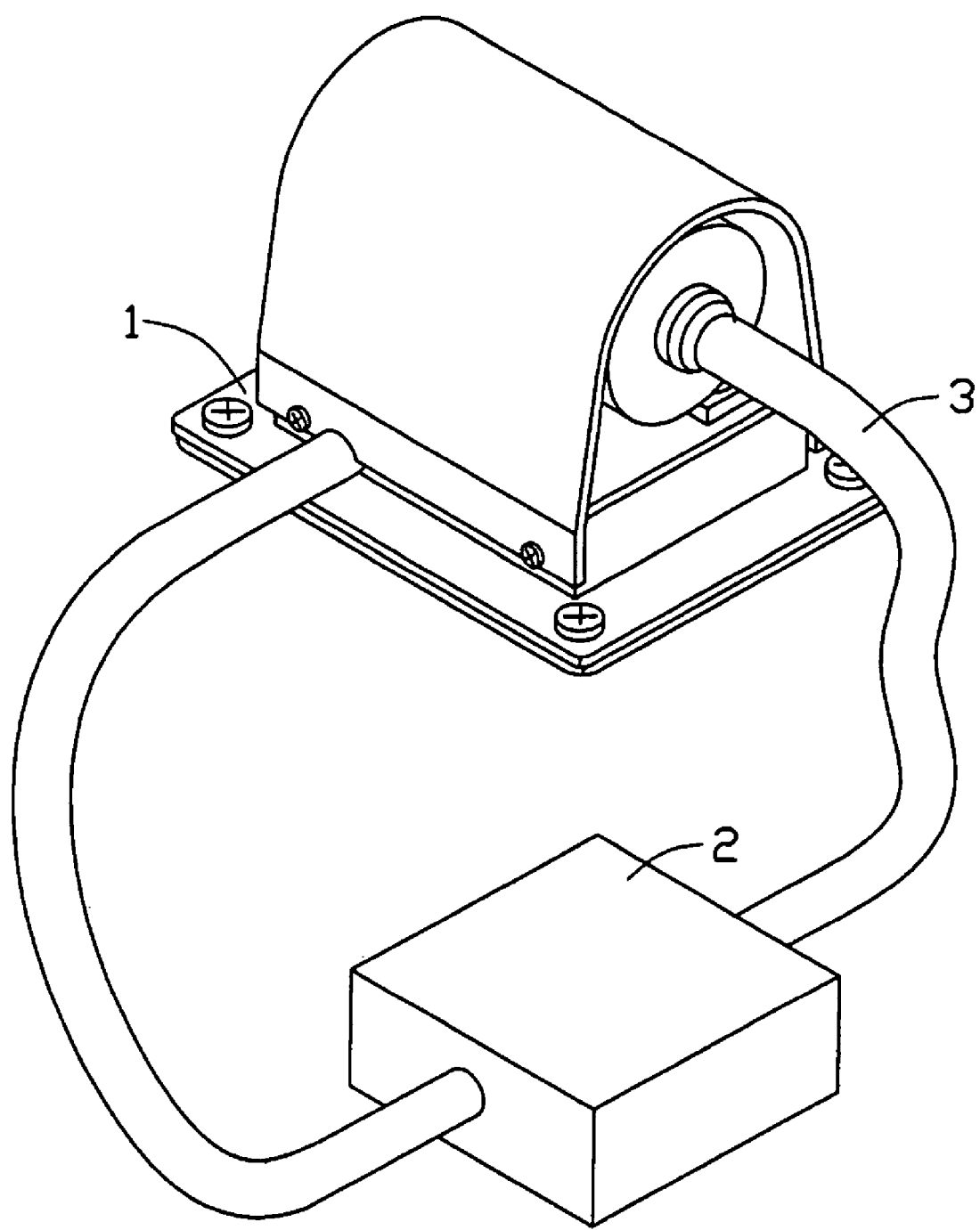
FIG. 1 is an assembled, schematic view of a liquid cooling system in accordance with the preferred embodiment of the present invention.

Referring to FIG. 1, a liquid cooling system in accordance with a preferred embodiment of the present invention comprises a heat absorbing unit 1 for thermally contacting a heat generating component (not shown), and a heat dissipation unit 2. Coolant is filled in the heat absorbing unit 1 for absorbing heat from the heat generating component, and flows through a pipe 3 to the heat dissipation unit 2 for cooling. The cooled coolant then returns to the heat absorbing unit 1 by means of the pipe 3 for a next circulation. The heat dissipation unit 2 is any combination of a heat sink and a cooling fan.

Figure 2:
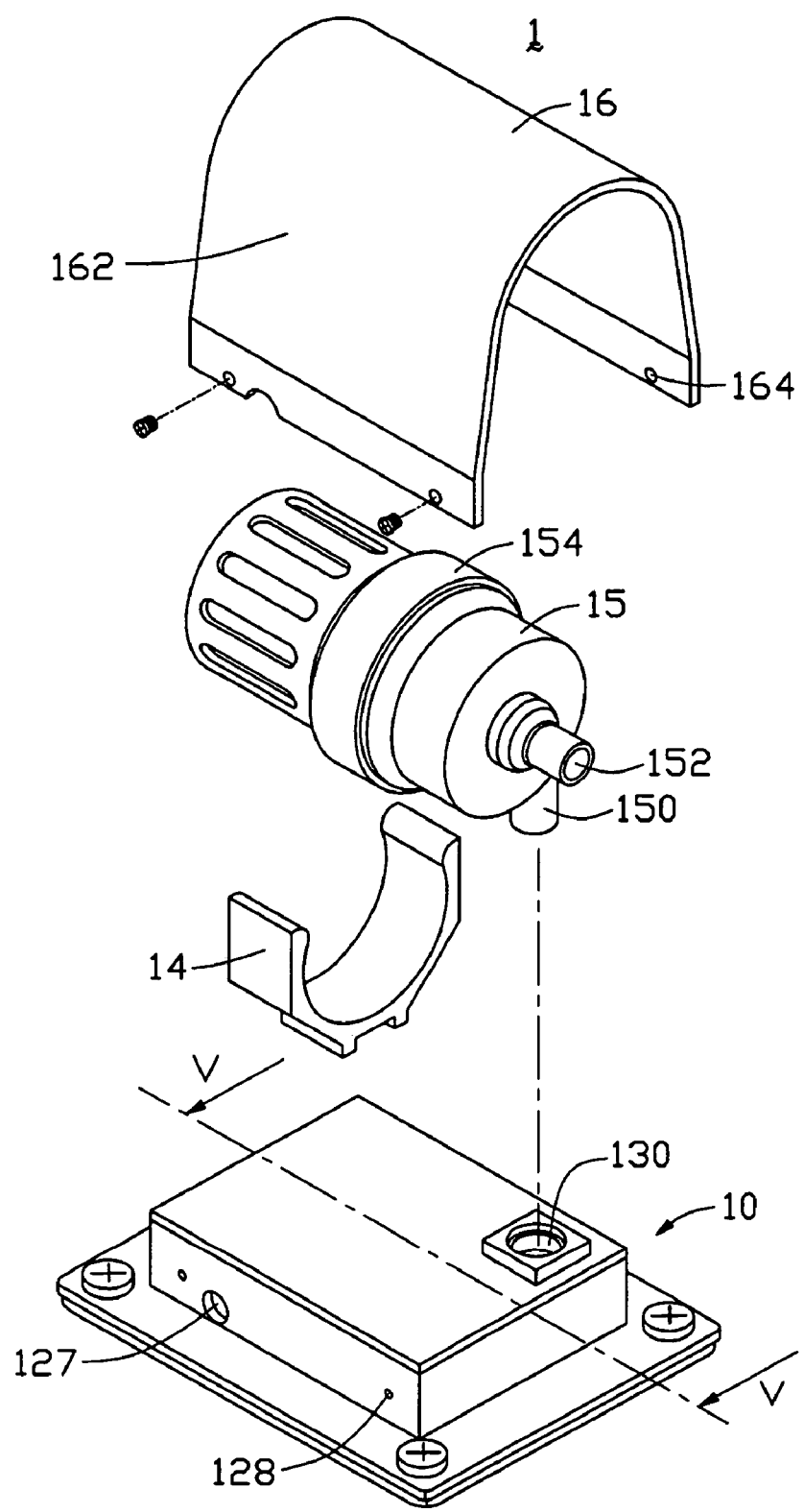
FIG. 2 is an exploded, isometric view of the heat absorbing unit of the liquid cooling system of FIG. 1.

Referring to FIG. 2, the heat absorbing unit 1 comprises a container 10, and a flow driver such as a pump 15 mounted on the container 10.

Figure 3:
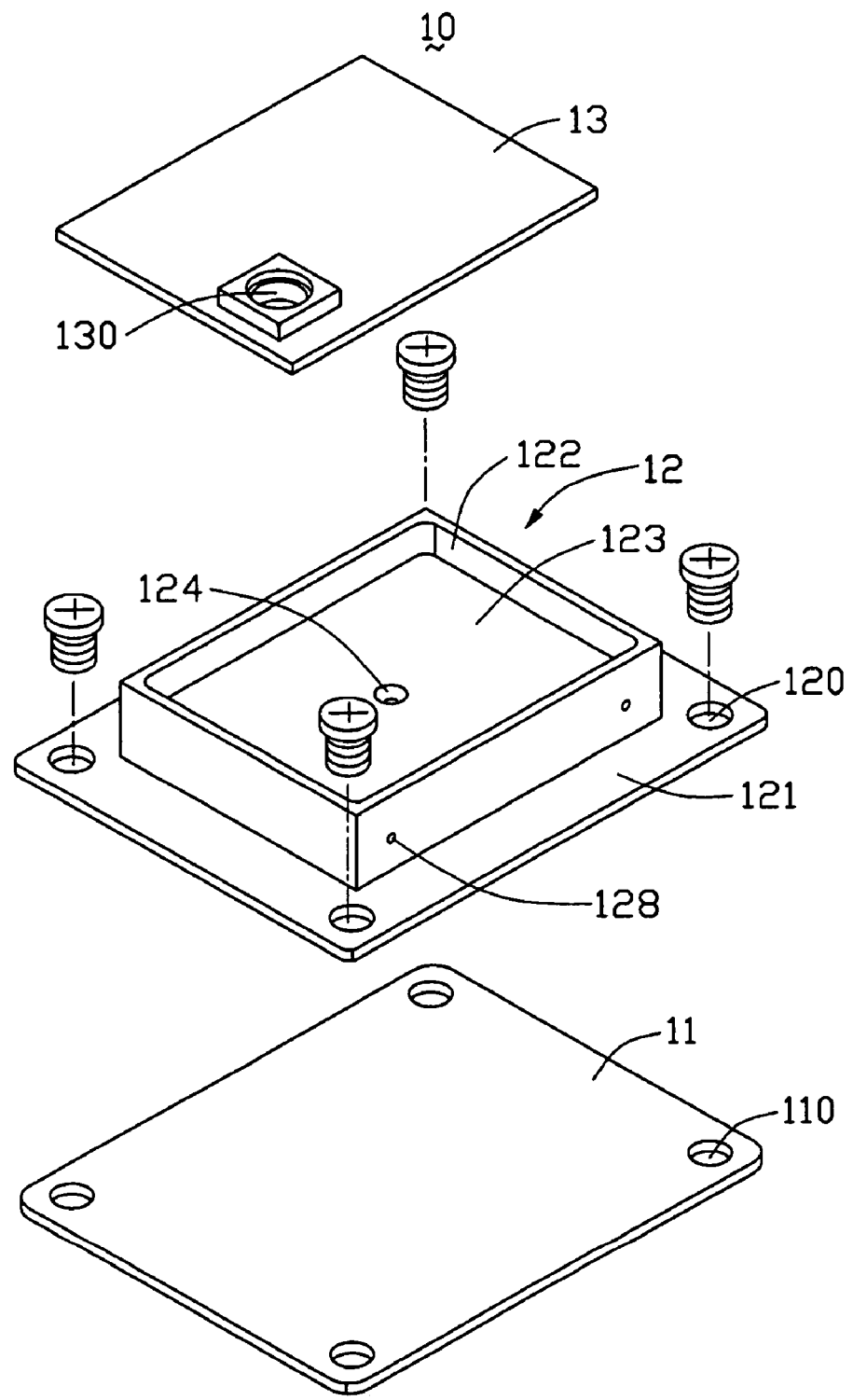
FIG. 3 is an exploded, isometric view of the container of the heat absorbing unit of FIG. 2.
Figure 4:
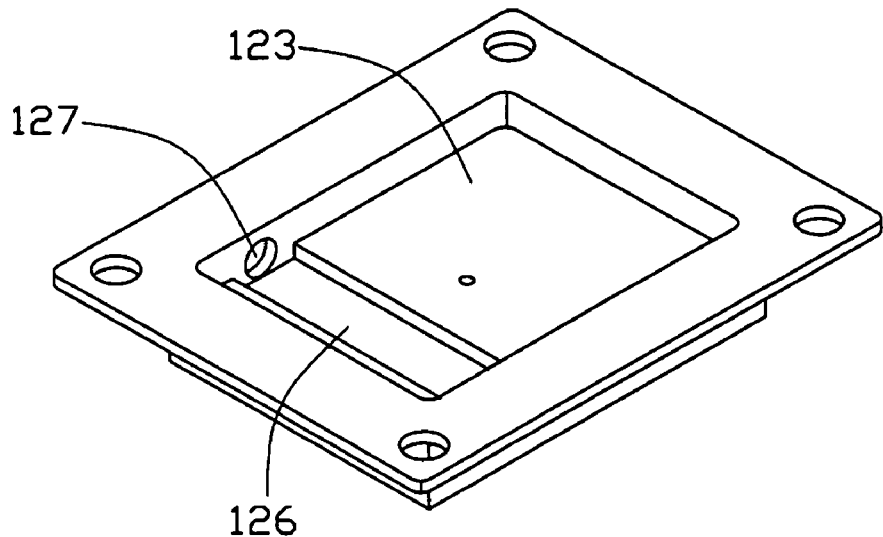
FIG. 4 is an isometric view of the main body of the container of FIG. 3, viewed from another aspect.
Figure 5:
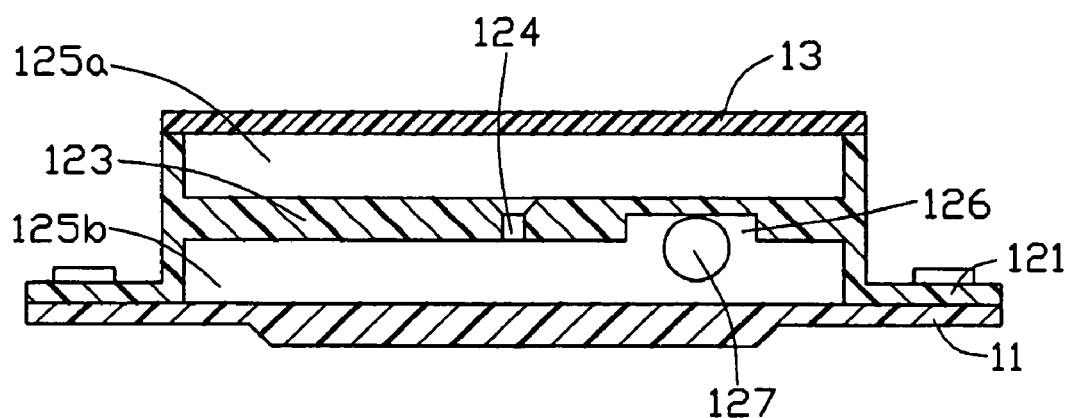
FIG. 5 is a cross-sectional view taken along the line V—V of FIG. 2.

Further referring to FIG. 3, the container 10 comprises a main body 12, a bottom plate 11 hermetically attached to an underside of the body 12, and a top cover 13 hermetically attached to an top side of the body 12. The bottom plate 11 is used for thermally contacting the heat generating component to absorb heat therefrom. The main body 12 comprises four walls 122 connected to each other to form a frame with an inner space (not labeled), and a mounting flange 121 extending perpendicularly and outwardly from bottom edges of the walls 122. Referring also to FIGS. 4 and 5, a spacing wall 123 is arranged in the inner space of the frame. The spacing wall 123 is parallel to the mounting flange 121, and connects to middle portions of the walls 122 so that the inner space is effectively separated into two sections. When the bottom plate 11 and the top cover 13 are mounted to the main body 12, the two sections of the inner space are closed respectively thereby forming first and second chambers 125a, 125b. A through hole 124 is defined in the spacing wall 123. The coolant can thus flow between the first and second chambers 125a, 125b through the through hole 124.

One wall 122 defines an outlet 127 therein, communicating with the second chamber 125b. The outlet 127 is connected to one end of the pipe 3. The coolant can exit the second chamber 125b via the outlet 127, and flows to the heat dissipation unit 2 through the pipe 3. The spacing wall 123 forms a guide groove 126 in its underside, corresponding to the outlet 127 to guide the coolant out of the second chamber 125b via the outlet 127. A pair of screw holes 128 is defined in each of two opposite walls 122. The depth of the screw holes 128 is smaller than the thickness of these two walls 122, so that the screw holes 128 do not extend through the corresponding vertical walls 122 respectively.

Referring back to FIG. 3, the mounting flange 121 of the main body 12 defines four mounting holes 120 at four corners thereof. Four locking holes 110 are defined in the bottom plate 11, corresponding to the mounting holes 120 respectively. The bottom plate 11 can be mounted to the main body 12 by four fasteners, such as screws (not labeled). To attain a good sealing capability, a sealing gasket (not shown) may be provided between the mounting flange 121 and the bottom plate 11.

The top cover 13 defining an inlet 130 via which the coolant can enter the first chamber 125a. The top cover 13 is mounted onto the main body 12 by soldering. Riveting means or screw means may alternatively be adopted.

Referring back to FIG. 2, the pump 15 has a generally cylindrical periphery. An enlarged mounting portion 154 is formed along the cylindrical periphery. An entrance port 152 and an exit port 150 are formed respectively at one of two ends of the pump 15. The exit port 150 extends through the inlet 130 of the top cover 13 into the first chamber 125a. The coolant can thus be pumped into the first chamber 125a via the exit port 150. The entrance port 152 is connected to the pipe 3. The coolant can thus be pumped and driven out of the pipe 3 within the heat dissipation unit 2, and flow back to the pump 15.

A positioning assembly for the pump 15 comprises a bearing block 14 fixed on the top cover 13, and a positioning bracket 16 detachably mounted onto the main body 12. The bearing block 14 has an arcuate bearing surface, corresponding to the periphery of the mounting portion 154 of the pump 15. The positioning frame 16 has a U-shaped configuration, and comprises a pair of opposite sidewalls 162 cooperatively defining a space therebetween for accommodating the pump 15 therein. A pair of through apertures 164 is defined at a free edge of each sidewall 162, corresponding to the screw holes 128 of the container 10 respectively. After the pump 15 is disposed on the bearing block 14, the positioning frame 16 is attached to the container 10 by using four screws (not labeled) extending through the through apertures 164 and being fixed in the screw holes 128 respectively, thereby positioning the pump 15 on the container 10.

In operation of the liquid cooling system, the coolant in the second chamber 125b absorbs heat from the bottom plate 11 which absorbs the heat from the heat generating component. Then the heated coolant exits the second chamber 125b from the outlet 127 and enters the heat dissipation unit 2 for cooling via the pipe 3 by the driving force of the pump 15. Afterwards, the coolant is pumped into the first chamber 125a from the pipe 3 by the pump 15, and then flows into the second chamber 125b via the through hole 124 of the spacing plate 123 for a next circulation. In this way, circulation of the coolant can continuously remove the heat from the heat generating component.

In the present invention, the container 10 forms first and second chambers 125a, 125b therein, and the pump 15 communicates directly with the first chamber 125a, thereby eliminating the need for additional ducting means. In addition, the entire cooling system is subdivided into two modules, namely the heat absorbing unit 1 and the heat dissipation unit 2, before using. Installation or removal of the liquid cooling system within any electronic device enclosure is simplified.

In the present invention, the pump 15 communicates directly with the first chamber 125a, and communicates with the second chamber 125b by the pipe 3. Therefore, the pipe 3, the pump 15, the first and second chambers 125a, 125b together form a loop for circulation of the coolant. The heat dissipation unit 2 is located at the path along which the pipe 3 extends, for cooling the coolant. The heat dissipation unit 2 defines a heat exchange channel for receiving the pipe 3, thereby cooling the coolant flowing in the pipe 3. Another alternative arrangement is that the heat dissipation unit 2 defines a heat exchange cavity for directly receiving the coolant. In the latter embodiment, two separate pipes 3 are needed, wherein one pipe 3 is connected between the second chamber 125b and the heat exchange cavity of the heat dissipation unit 2, and the other pipe 3 is connected between the pump 15 and the heat exchange cavity of the heat dissipation unit 2.

It is understood that the invention may be embodied in other forms without departing from the spirit thereof. The above-descinner walled examples and embodiments are to be considered in all respects as illustrative and not restrictive, and the invention is not to be limited to the details given above.

What is claimed is:

1. A liquid cooling system comprising:
   a container defining therein a first chamber and a second chamber under the first chamber, the first and second chambers being communicable with each other;
   coolant received in the container;
   a flow driver directly mounted on an outer side of the container, the driver comprising an entrance port, and an exit port in flow communication with the first chamber; and
   a heat dissipation unit located outside the container and fluidly communicating between the entrance port of the flow driver and the second chamber for cooling the coolant;
   wherein the container comprises a main body, and a bottom attached to an underside of the main body, and a top cover mounted onto a top side of the main body;
   wherein the main body comprises a frame having a plurality of walls connected with each other to cooperatively define an inner space therebetween, and a mounting flange extending from edges of the walls and secured with the bottom plate; and
   wherein the main body comprises a spacing wall connected to middle portions of the vertical walls, the first chamber is formed between the spacing wall and the top cover, and the second chamber is formed between the spacing wall and the bottom plate.

2. The liquid cooling system as described in claim 1, wherein the spacing wall defines a through hole therein in flow communication with both of the first and second chambers.

3. The liquid cooling system as described in claim 1, wherein the top cover defines an inlet, and the exit port of the flow driver extending into the inlet directly.

4. The liquid cooling system as described in claim 1, wherein one of the walls defines an outlet communicating with the second chamber.

5. The liquid cooling system as described in claim 4, wherein the spacing wall forms a groove corresponding to the outlet.

6. The liquid cooling system as described in claim 1, wherein the driver is mounted to the container by a positioning assembly comprising a bearing block mounted on the top cover, and a positioning bracket detachably attached to the main body.

7. The liquid cooling system as described in claim 1, wherein the heat dissipation unit fluidly communicates between the entrance port of the flow driver and the second chamber by a pipe.

8. A liquid cooling system comprising:

a heat absorbing unit comprising:

a container of coolant, the container comprising a first chamber and a second chamber with a spacing plate located therebetween, and a heat absorbing member attached below the second chamber, and a flow driver attached on the container and cooperatively integrated with the container into a module, the flow driver comprising an exit port directly inserted into the first chamber without additional ducting means and an entrance port connected with the second chamber with a pipe;

a heat dissipation unit; and a channel extending from the heat absorbing unit to the beat dissipation unit and back to the heat absorbing unit to provide a circulating path for the coolant; wherein the coolant is drivable along the channel for transferring heat from the heat absorbing member to the heat dissipation unit and wherein a through hole is defined in a center of the spacing plate.

9. The liquid cooling system as described in claim 8, wherein the first chamber is above the second chambers.

10. The liquid cooling system as described in claim 8, wherein the flow driver comprises a pump.

11. The liquid cooling system as described in claim 8, wherein the channel comprises a pipe.

* * * * *